United States Patent
Kelkar

(10) Patent No.: US 6,300,838 B1
(45) Date of Patent: Oct. 9, 2001

(54) METHOD AND APPARATUS FOR DERIVATIVE CONTROLLED PHASE LOCKED LOOP SYSTEMS

(75) Inventor: Ram Kelkar, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/470,408

(22) Filed: Dec. 22, 1999

(51) Int. Cl.[7] .................. H03L 7/08; H03L 7/087
(52) U.S. Cl. ................... 331/17; 331/1 A; 331/11; 327/156; 327/157; 327/159
(58) Field of Search ................... 331/1 A, 10, 11, 331/18, 25, 34; 327/156–159

(56) References Cited

U.S. PATENT DOCUMENTS

| | | | |
|---|---|---|---|
| 3,337,813 | * 8/1967 | Graeve | 331/17 |
| 3,626,301 | * 12/1971 | Develet | 325/420 |
| 3,905,115 | 9/1975 | Waggener | 235/152 |
| 3,997,848 | * 12/1976 | Rippy | 329/122 |
| 4,835,481 | * 5/1989 | Geissler et al. | 328/155 |
| 4,849,998 | 7/1989 | Poklemba | 375/121 |
| 5,036,294 | * 7/1991 | McCaslin | 331/1 A |
| 5,115,208 | * 5/1992 | Masden et al. | 331/1 A |
| 5,233,314 | 8/1993 | McDermott et al. | 331/17 |
| 5,297,173 | * 3/1994 | Hikmet et al. | 375/118 |
| 5,477,195 | 12/1995 | Spilker | 331/11 |
| 5,537,449 | 7/1996 | Nezu | 375/376 |
| 5,546,433 | * 8/1996 | Tran et al. | 375/376 |
| 5,646,519 | 7/1997 | Hamilton et al. | 324/76.82 |
| 5,648,744 | * 7/1997 | Prakash et al. | 331/11 |
| 5,699,392 | * 12/1997 | Dokic | 375/376 |
| 5,757,857 | * 5/1998 | Buchwald | 375/271 |
| 5,878,090 | 3/1999 | Stephens | 375/326 |
| 5,982,821 | * 11/1999 | Kingston et al. | 375/326 |
| 6,016,080 | * 1/2000 | Zuta et al. | 331/25 |
| 6,133,770 | * 10/2000 | Hasegawa | 327/156 |

* cited by examiner

*Primary Examiner*—David Mis
(74) *Attorney, Agent, or Firm*—Richard A. Henkler

(57) ABSTRACT

An analog phase lock loop circuit having derivative control. The phase lock loop includes a phase detection circuit, main charge pump, a low pass filter, and a voltage controlled oscillator. The derivative control receives error signals from the phase detection circuit and outputs a derivative voltage to the voltage controlled oscillator to be included with the proportional and integral control of the low pass filter.

5 Claims, 5 Drawing Sheets

METHOD AND APPARATUS FOR DERIVATIVE CONTROLLED PHASE LOCKED LOOP SYSTEMS

BACKGROUND

1. Technical Field of the Present Invention

The present invention generally relates to phase locked loop systems, and more particularly, to methods and apparatuses that use derivative control in such phase locked loop systems.

2. Description of Related Art

Recent advances in integrated circuit manufacturing technology have allowed the number of transistors to increase on single integrated circuit chips, and increased the performance of the transistors. This is especially noticeable in high density synchronous circuits, such as microprocessors, math co-processors, single-chip microcomputers, and the like. This higher performance is typically obtained from synchronous circuits by increasing the frequency of the clock signal controlling the circuit.

Particularly at extremely high clock frequencies, parasitic impedances, propagation delays, and other effects, can cause the clock signals that are applied to different integrated circuits within a computer system to be skewed in time relative one to another. As a result, inter-chip communication within such computers is made more difficult at higher frequencies, thus, requiring wait states or other techniques to be used to reliably communicate the data The synchronization of multiple chips often tends to degrade the rate at which data can be communicated within the system, and thus degrade over all system performance. In addition, high frequency clock signals are especially vulnerable to certain instabilities in their duty cycle to noise, ringing, and other similar effects that may cause errors in the internal operation of the integrated circuits receiving such signals.

Phase-Locked Loops (PLLs) are conventionally implemented on integrated circuits to overcome these problems. A typical PLL includes a phase detector circuit, a low pass loop filter, and a voltage controlled oscillator (VCO). The phase detector circuit compares the phase of the input clock signal with the output of the VCO, and provides a control voltage to the VCO (after filtering by the loop filter) to adjust the frequency of the output signal. After several cycles, the PLL locks onto the input clock signal, and provides an output having a stable frequency and phase. A frequency divider may also be connected to the output of the VCO to provide an output clock at frequency different from the VCO frequency.

These traditional PLLs are implemented using an integral and a proportional control. Although such control may be suitable for some applications, it would be further desirable to have an additional control that would take into account the rate of change at which the errors are occurring (derivative). It would be further advantageous if the derivative control could be used in addition to the integral and proportional control. The present invention teaches such a combined integral, proportional, and derivative control PLL system.

SUMMARY OF THE PRESENT INVENTION

The present invention is a method and apparatus for providing derivative control in combination with integral and proportional control of a phase locked loop.

BRIEF DESCRIPTION OF THE DRAWINGS

The present invention will be better understood and its numerous objects and advantages will become more apparent to those skilled in the art by reference to the following drawings, in conjunction with the accompanying specification, in which.

DETAILED DESCRIPTION OF THE PREFERRED EMBODIMENT OF THE PRESENT INVENTION

In the following description, numerous specific details are set forth such as specific word or byte lengths, etc., to provide a thorough understanding of the present invention. However, it will be obvious to those of ordinary skill in the art that the present invention can be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention, and are within the skills of persons of ordinary skill in the relevant art.

Figure 1:
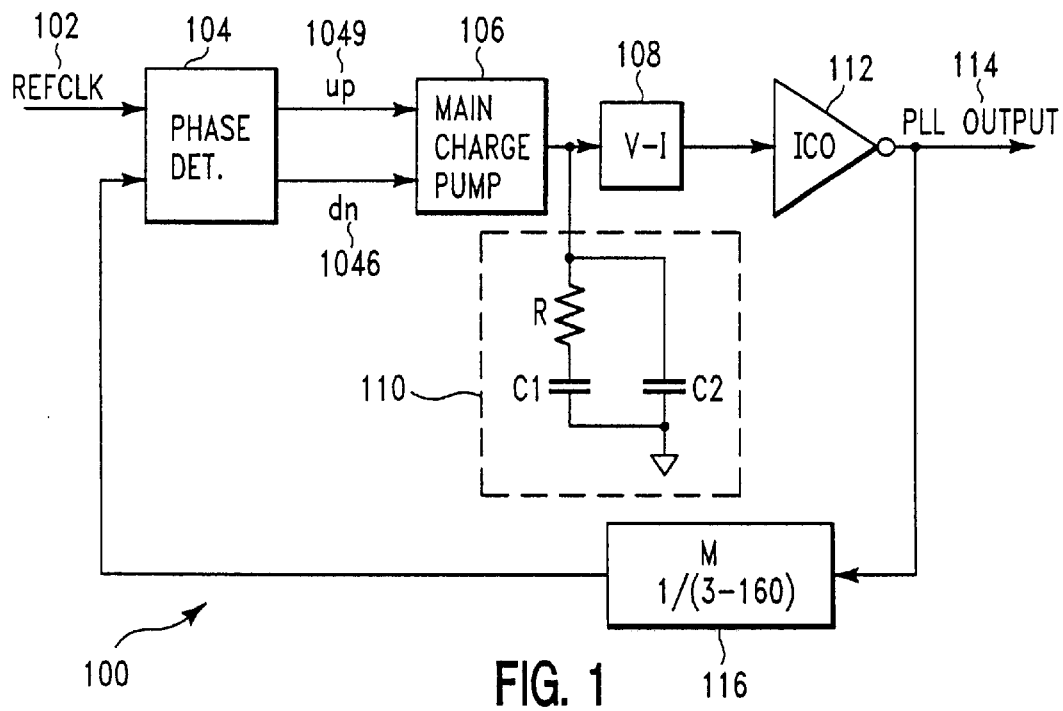
FIG. 1 is a schematic diagram of a typical Phase Locked Loop system.

FIG. 1 is a schematic diagram of a typical Phase Locked Loop system 100. PLL 100 includes a phase detector 104, a main charge pump 106, a low pass filter 110, a voltage controlled oscillator (v-i 108, and ICO 112), and a feedback divider 116. A reference clock 102 is fed into the phase detector 104 as well as the output from the feedback divider 116. Phase detector 104 denotes any differences between the phases of the reference clock and the PLL output 114 via output signals up 104*a* and down 104*b*. The error signals provided on outputs up 104*a* and down 104*b* are typically a train of pulses having a width that denotes the phase error between the reference clock 102 and PLL output 114. Obviously, when reference clock 102 and PLL output 114 are in phase, the width and pulses of the error signals provided at the up 104*a* and down 104*b* outputs are equivalent. The error signals provided on the up 104*a* and down 104*b* outputs are fed into a main charge pump 106. The main charge pump 106 outputs current pulses that are equal in width to the error and a magnitude that is predetermined by the reference current used in the particular design. These current pulses are then fed to a low pass filter 110 comprising a R-C1-C2 structure. The voltage developed across the low pass filter 110 is provided to v-i circuit 108 which converts the voltage developed across the filter to a current which is then provided to the current oscillator ICO 112 to generate the PLL Output signal 114.

An examination of how the control voltage to the v-i component 108 is developed reveals the nature of the control mechanism used for the PLL system 100. Specifically, current pulses develop a voltage across the resistor R which is proportional to the error (i.e. v=I * R). In addition, the voltage developed across the capacitor C1 is the integral of the charge pumped into or removed from the capacitor C1 (basic definition of capacitance). Thus, it can be clearly seen that the typical PLL system 100 uses both proportional as well as integral control.

The present invention adds an additional derivative control portion to the conventional PLL system 100 of FIG.. 1. The addition of the derivative control component uses the slope of the error signal in the overall control process to better predict the system behavior as explained in greater detail in connection with the description of FIG. 2.

Figure 2:
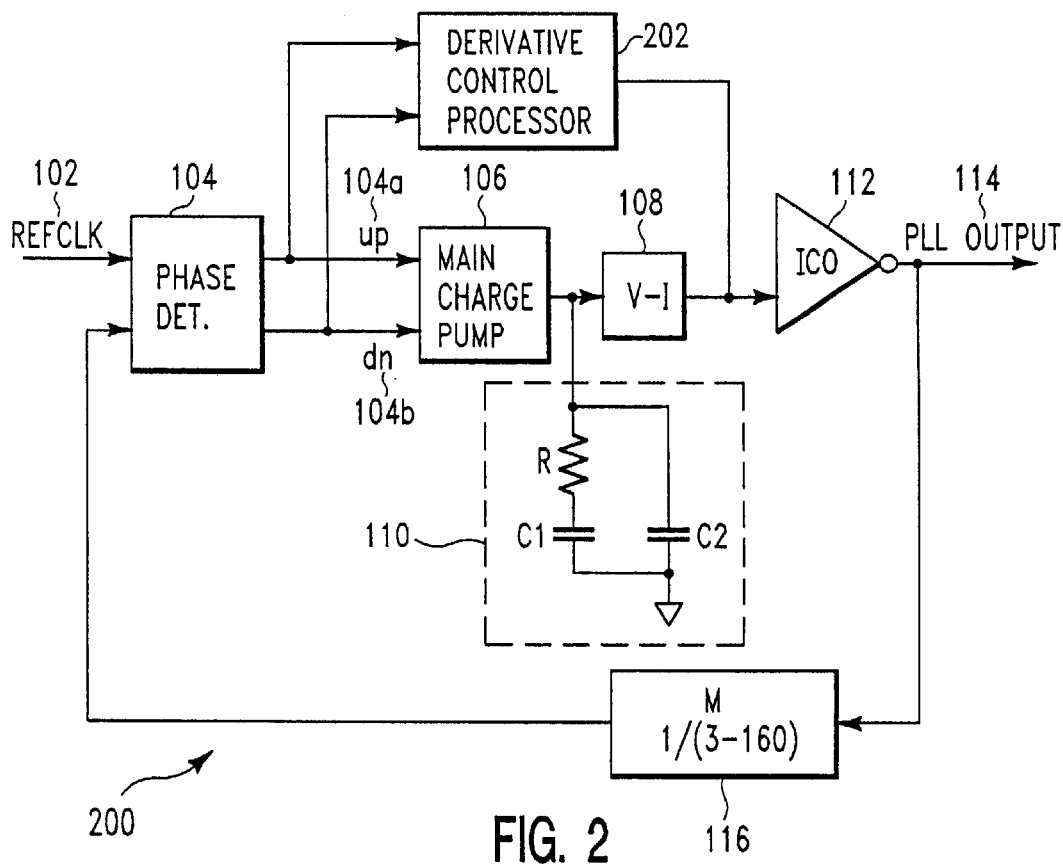
FIG. 2 is a schematic diagram of a PLL system implementing derivative control according to the teachings of the preferred embodiment of the present invention.

FIG. 2 is a schematic, diagram of a PLL system 200 implementing derivative control according to the teachings of the preferred embodiment of the present invention. The PLL system 200 comprises a phase detector 104, a main charge pump 106, a v-i component 108, a low pass filter 110, a current control oscillator 112, a frequency divider 116, and a derivative control processor 202. The various functions and purpose of the phase detector 104, main charge pump 106, low pass filter 110, v-i 108, ICO 112, and frequency divider 116 were explained in detail in connection with FIG. 1 and are equally applicable to PLL system 200. As previously noted, the error signal is encoded in the varying pulse widths on the up 104a and down 104b outputs. The slope of the error (derivative) is the difference in the pulse width provided on the up 104a and down 104b outputs.

The derivative control processor 202 takes the signals provided on the up 104a and down 104b outputs and creates a delayed version of those outputs, and compares the delayed version with the original outputs. The specific means for creating such a delayed signal are numerous, and readily available to those of ordinary skill in the art. Consequently, the description provided below in connection with FIG. 3 is merely one example of how such signals might appear.

Figure 3:
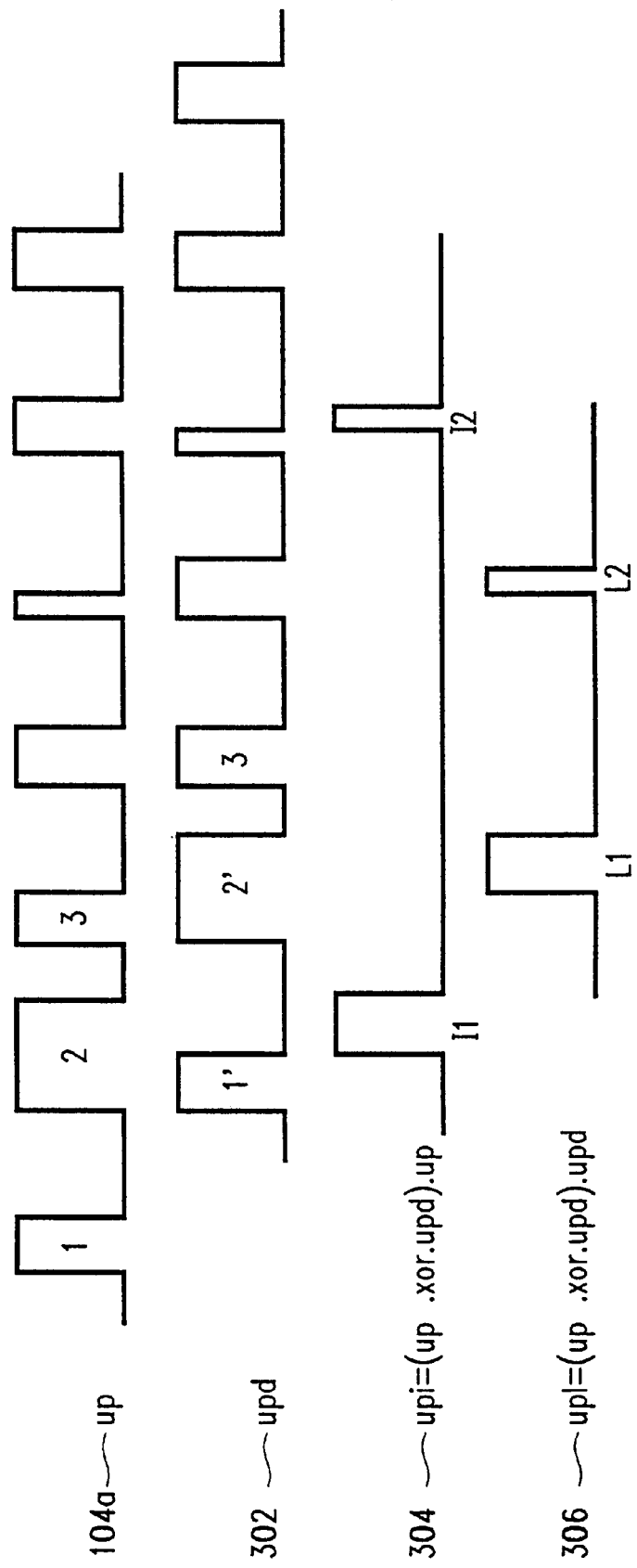
FIG. 3 is a simulation timing diagram illustrating in detail the simulated signals provided at the up output and its enhancement by the derivative control processor of FIG. 2 according to the teachings to the preferred embodiment of the present invention.

FIG. 3 is a timing diagram illustrating in detail the signals provided at the up 104a output and its enhancement by the derivative control processor 202 of FIG. 2 according to the teachings to the preferred embodiment of the present invention. In this particular example, only the output of the up error signal 104a is shown and described, since the signal from the output down 104b is treated in exactly the same fashion. Further, the illustrated up 104a signal has pulse widths that increase and decrease abruptly, as opposed to a more gradual change in usage, in order to further clarify the various advantages of the present invention. It should also be noted, that the signal provided on the up 104a output is at the same frequency as the input to the phase detector 104, since it is controlled by the rising edges of the phase detector input frequencies (reference clock 102 and divider output 116). Signal UPD 302 is generated in the derivative control processor 202 by delaying the error signal provided on the up 104a output by one period.

The two signals UPI 304 and UPL 306 are generated by performing various operations on combined UP error signal 104a and the delayed UPD 302 signal. The signal UPI 304 represents any increases in the error rate, and is created by the logical AND of the up error signal 104a with the XOR product of the up signal 104a and the delayed UPD 302 signal period (UP(UP XOR UPD)). The UPL 306 signal is created by the ANDing of the UPD 302 signal with the product of the XOR of the UP 104a signal with the UPD 302 signal (UPD (UP XOR UPD)).

An example of the generation of pulse 1, of the UPI 304 signal, pulse 2 of error UP signal 104a is wider than pulse 1, thus, the error is increasing. In example for the generation of the pulse L1 of the UPL 306 signal, since pulse 3 is less than pulse 2 of UP 104a signal, the error is decreasing.

In summary, each pulse created at the UPI 304 signal indicates an increase in the error in the direction such that the PLL output 114 needs to be increased. Each pulse at the UPL 306 signal indicates a decrease in the error in the direction such that ICO frequency needs to be lowered. The generation of a delayed, increased and decreased indication signals UPD 302, UPI 304, UPL 306, respectively for the output of the error signal of the down output 104b are generated in the same fashion as the previously described signals, with the only difference being that a pulse width increase at a DNI signal would indicate that the ICO frequency needs to be decreased, while a pulse width at the DNL signal would indicate that the PLL output needs to be increased. The new signal thus created (DNI and DNL) are feed into a charge pump (not shown) of the Derivative Control Processor 202 that pumps an appropriate amount of current into the ICO 112.

To further illustrate the advantages of the combined derivative and integral control in PLL system 200, simulation diagrams are provided hereinafter and explained in connection with FIGS. 4 and 5.

Figure 4:
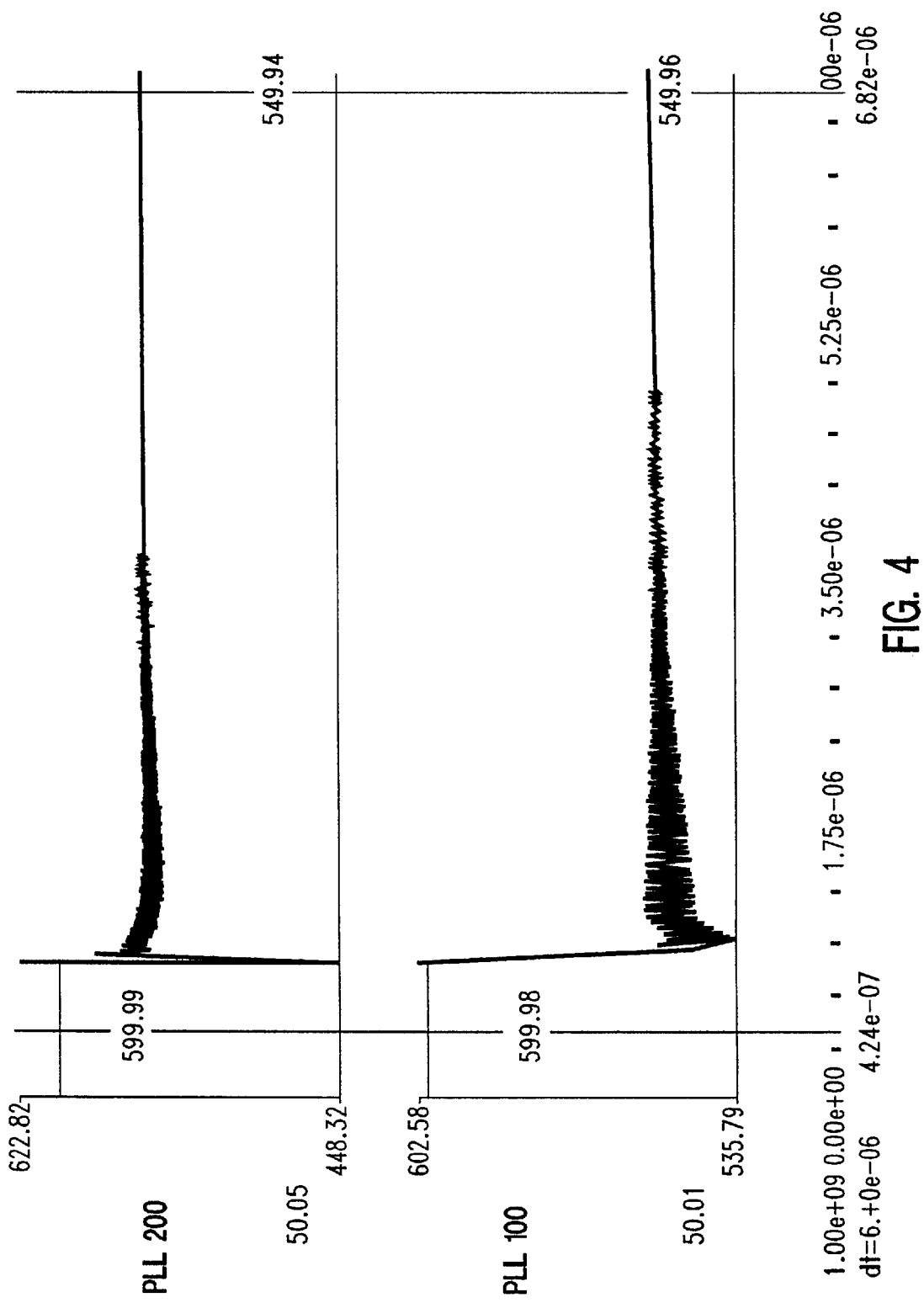
FIG. 4 is a simulation timing diagram illustrating simulated output from the PLL systems of FIGS. 2 and 1.

FIG. 4 is a simulation timing diagram illustrating simulated output from the PLL system 200 and PLL system 100 of FIGS. 2 and 1, respectively. The simulations were derived using Fortran functionality with the vertical axis representing frequency and the horizontal axis representing time. As illustrated, both PLL systems 100 and 200 are initially operating at approximately a frequency of 600 MHz, when the feedback divider 116 value changes from 12 to 11 resulting in a change in the VCO frequency to 550 MHz. The response of the derivative PLL system 200 is illustrated at the top of the figure; while the response of the integral only PLL system 100 is illustrated in the bottom part of the figure. It is clearly illustrated that the derivative PLL system 200 settles down to its final value earlier.

Figure 5:
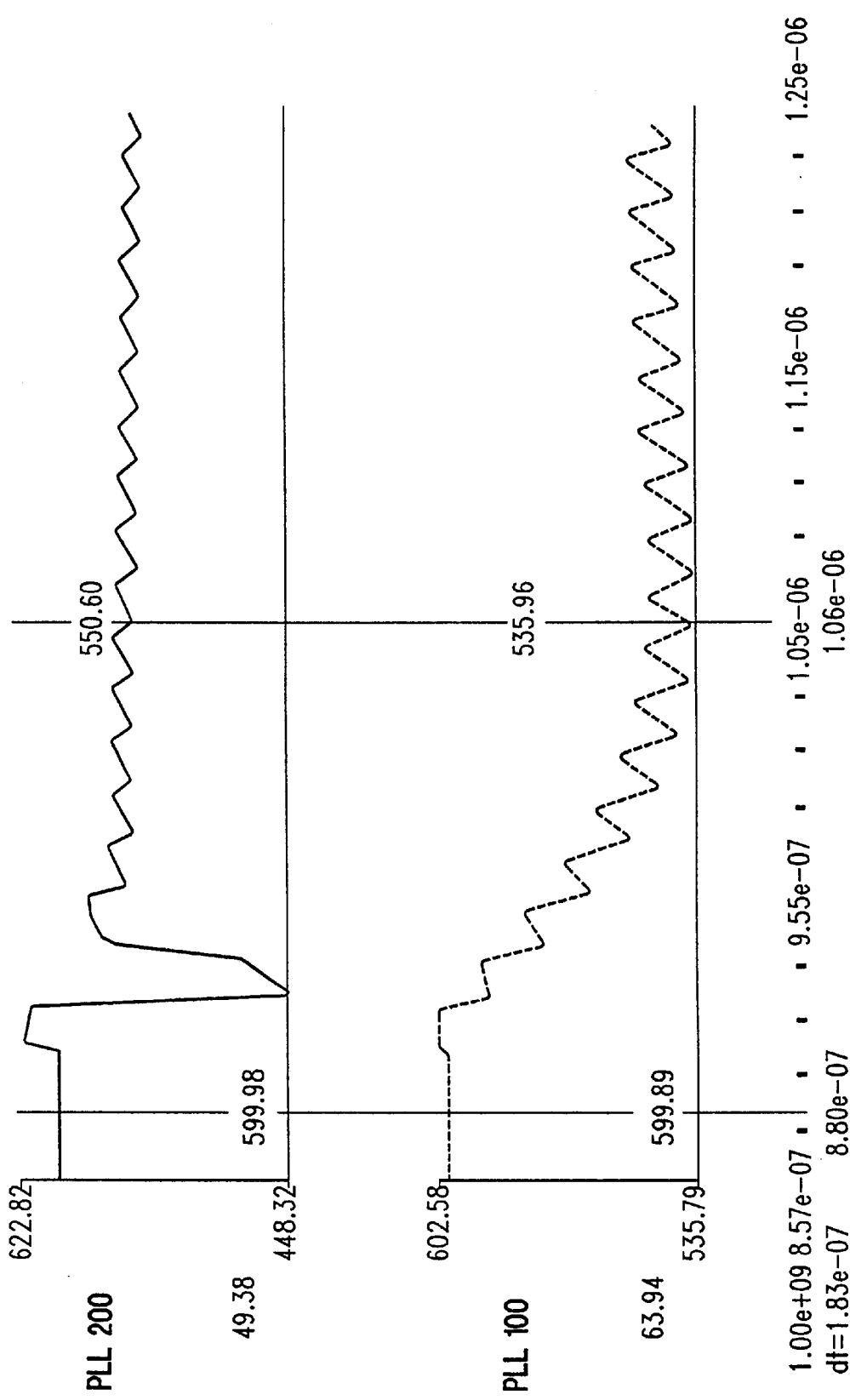
FIG. 5 is a simulation timing diagram illustrating a blowup of the first part of the response of FIG. 4.

FIG. 5 is a detailed blowup of the first part of the response of FIG. 4. Once again, the output of the derivative enhanced PLL 200 is illustrated at the top portion and the integral only PLL system 100 is illustrated on the bottom portion with the x and y axis representing time and frequency, respectively. It can clearly be seen that the derivative enhanced PLL 200 approaches its final value of 550 MHz at a significantly earlier time period. Those skilled in the art, realize that frequency agility (quickness of response to a change in PLL programming) is an important specification for PLLs in many applications such as graphics and MPEG.

Figure 6:
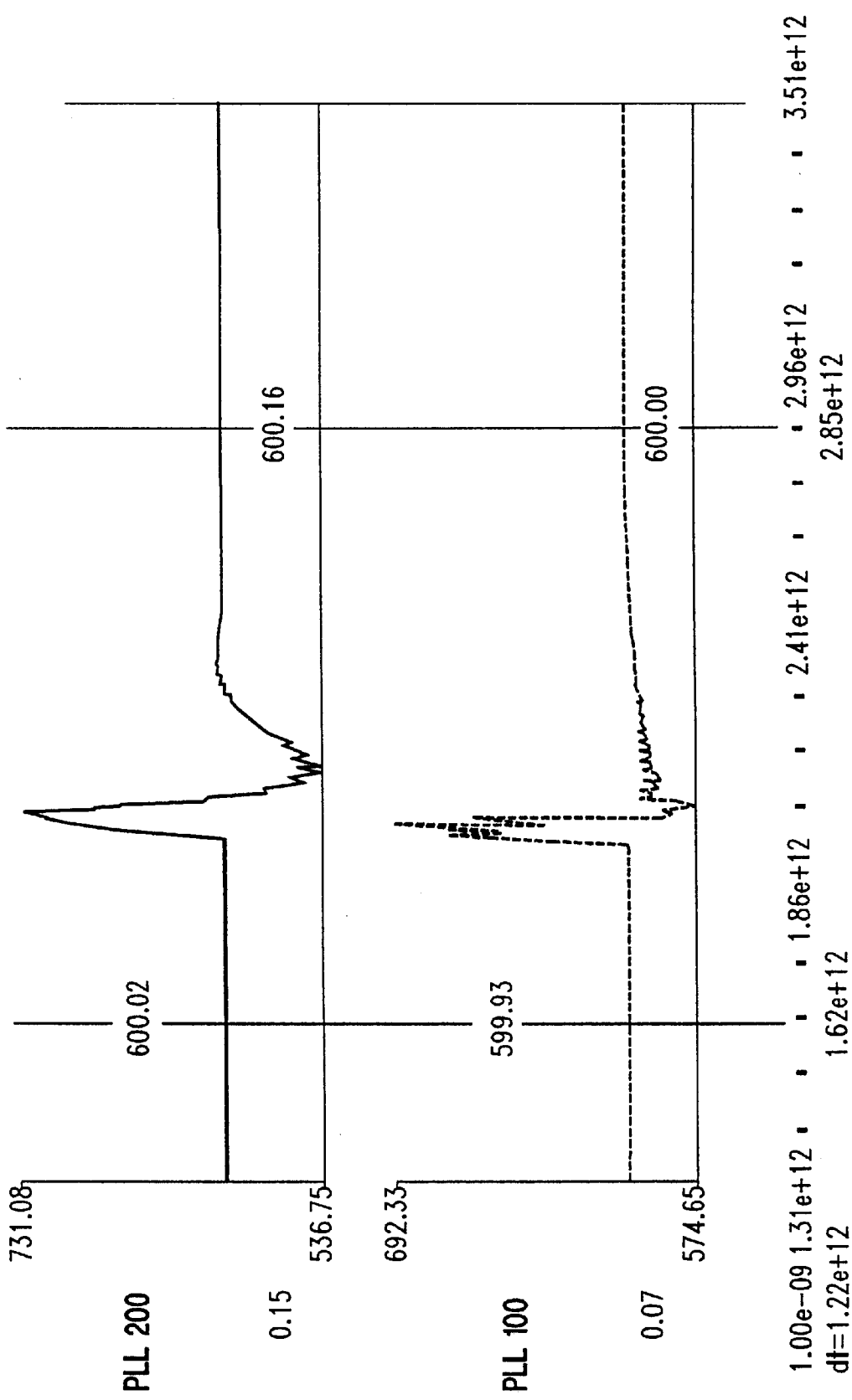
FIG. 6 is a simulated timing diagram of the response to a pulse disturbance at the ICO inputs of FIGS. 1 and 2 according to the teachings of the present invention.

FIG. 6 is a simulated timing diagram of the response to a pulse disturbance at the ICO 112 input of FIGS. 1 and 2 according to the teachings of the present invention. The pulse disturbance could be, for example, that which is commonly associated with noise. In both cases, the PLLs 200 and 100 frequency first increases (in response to the pulse) and then recovers to its original value after the pulse disappears. In such situations it is important that the system it is important that the system is not disturbed as far as possible, since the change is unwanted. With derivative control (PLL 200) it is clearly seen that both the overshoot and the undershoot are substantially reduced. It is the anticipatory feature of derivative control that makes this possible.

It is thus believed that the operation and construction of the present invention will be apparent from the foregoing description. While the method and system shown and described has been characterized as being preferred, it will be readily apparent that various changes and/or modifications could be made wherein without departing from the spirit and scope of the present invention as defined in the following claims.

What is claimed is:

1. An analog phase lock loop circuit comprising:
 a voltage controlled oscillator for generating an output signal that is representative of any received voltages;
 a phase detection circuit for generating error signals each of which indicate phase differences between a reference clock and the output signal;
 a main charge pump for generating a current that is representative of the error signals;
 a low pass filter for receiving the generated current and generating a voltage input to the voltage controlled oscillator; and
 a derivative control circuit for generating a derivative voltage representation of the error signals as a voltage input to the voltage controlled oscillator.

2. The analog phase lock loop of claim 1 wherein the derivative control circuit includes:
 circuitry for creating delayed error signals representing the error signals delayed by a predetermined period of time.

3. The analog phase lock loop of claim 2 wherein the derivative control circuit includes:
 circuitry for generating a derivative voltage representative of the differences between the delayed error signals and the error signals.

4. The analog phase lock loop of claim 3 wherein the predetermined time period is one period.

5. The analog phase lock loop of claim 3 wherein the derivative control circuit includes a charge pump.

* * * * *